United States Patent
Ho et al.

(10) Patent No.: US 10,726,779 B2
(45) Date of Patent: Jul. 28, 2020

(54) ELECTRONIC DEVICES WITH DISPLAYS HAVING INTEGRATED DISPLAY-LIGHT SENSORS

(71) Applicant: Apple Inc., Cupertino, CA (US)

(72) Inventors: Meng-Huan Ho, San Jose, CA (US); Haojiang Zhou, Pasadena, CA (US); Cheng Chen, San Jose, CA (US); Rui Liu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/175,546

(22) Filed: Oct. 30, 2018

(65) Prior Publication Data

US 2019/0237008 A1    Aug. 1, 2019

Related U.S. Application Data

(60) Provisional application No. 62/623,453, filed on Jan. 29, 2018.

(51) Int. Cl.
*G09G 3/3208* (2016.01)

(52) U.S. Cl.
CPC ...... *G09G 3/3208* (2013.01); *G09G 2320/0233* (2013.01); *G09G 2320/0295* (2013.01); *G09G 2320/046* (2013.01); *G09G 2360/147* (2013.01)

(58) Field of Classification Search
CPC ........... G09G 3/3208; G09G 2360/147; G09G 2320/0233; G09G 2320/046; G09G 2320/0295; G09G 3/3233; G09G 2360/145; G09G 2360/148; G09G 2320/0223; G09G 2320/043; G09G 2320/045

See application file for complete search history.

(56) References Cited

U.S. PATENT DOCUMENTS

| | | | |
|---|---|---|---|
| 9,530,381 B1 * | 12/2016 | Bozarth | H05B 37/02 |
| 2004/0145792 A1 * | 7/2004 | Maeyama | G02B 26/105 |
| | | | 359/239 |
| 2010/0013850 A1 * | 1/2010 | Kwon | G09G 3/3406 |
| | | | 345/589 |
| 2010/0118003 A1 * | 5/2010 | Yamashita | G09G 3/3233 |
| | | | 345/205 |
| 2013/0147858 A1 * | 6/2013 | Omoto | G09G 3/30 |
| | | | 345/690 |

* cited by examiner

*Primary Examiner* — Md Saiful A Siddiqui
(74) *Attorney, Agent, or Firm* — Jaffery Watson Mendonsa & Hamilton LLP (57) ABSTRACT

Aspects of the subject technology relate to electronic devices with displays. The display includes an array of display pixels and one or more display-light sensors that monitor the display light generated by the display pixels. Using the display-light sensors, corrections to control signals for the display pixels can be provided to correct for array non-uniformities and/or pixel degradation over time. The display-light sensors may be provided in an array of display-light sensors mounted parallel to the array of display pixels. The array of display-light sensors can be in-plane with the display pixels or vertically displaced from the display pixels. The display-light sensors may be prevented from receiving non-display light such as ambient light.

20 Claims, 5 Drawing Sheets

ELECTRONIC DEVICES WITH DISPLAYS HAVING INTEGRATED DISPLAY-LIGHT SENSORS

CROSS-REFERENCE TO RELATED APPLICATIONS

The present application claims the benefit of priority under 35 U.S.C. § 119 from U.S. Provisional Application No. 62/623,453, entitled "ELECTRONIC DEVICES WITH DISPLAYS HAVING INTEGRATED DISPLAY-LIGHT SENSORS," filed on Jan. 29, 2018, the entirety of which is incorporated herein by reference.

TECHNICAL FIELD

The present description relates generally to electronic devices with displays, and more particularly, but not exclusively, to electronic devices with displays having integrated display-light sensors.

BACKGROUND

Electronic devices are often provided with displays such as organic light-emitting diode (OLED) displays or liquid crystal displays (LCDs). However, it can be challenging to maintain the front-of-screen uniformity of the display over the lifetime of the device.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The subject disclosure provides electronic devices such as cellular telephones, media players, computers, set-top boxes, wireless access points, and other electronic equipment that may include displays. Displays may be used to present visual information and status data and/or may be used to gather user input data. A display may include an array of display pixels. Each display pixel may include one or more colored subpixels for displaying color images. For example, each display pixel may include a red subpixel, a green subpixel, and blue subpixel.

Each display pixel or subpixel generates light based on display data for generating images, text, video, or other display content on the front of the display. Display data to be displayed by the display pixels is converted to analog control signals such as control voltages or currents for each display pixel to generate the desired amount of light corresponding to the display data. However, over time, the performance of one or more display pixels can change or degrade, often due to extended operation of the display pixels.

For example, screen burn-in is one common issue that can affect a display such as an organic light-emitting diode (OLED) display. Screen burn-in is commonly caused by long-time driving of the display pixels with high brightness at certain local areas of the pixel array. For example, a background image, a lockscreen image, or a clock or calendar display that is displayed by the display more often than other changing display content can cause a change in performance of portions of the display that are used to display that content. OLED pixels in areas that are more often used to display bright display content will decay faster than pixels in other areas, which can result in the screen burn-in effect. When a screen burn-in effect is present in a display, the front-of-screen (FoS) appearance of intended display content may not appear as desired. For example, a user's image that is displayed on the display may appear to have an additional embedded imprint (e.g., of a clock display or a background image that is commonly provided on the display) erroneously overlaid on the intended display content.

Moreover, static non-uniformities in the front-of-screen appearance can be caused by thin-film-transistor (TFT) circuit variation in driving circuitry for the pixel array, individual OLED pixel efficiency variations, and/or IR drop effects across the display. Non-uniformities of this type can include, for example, an unintended gradient across the display.

In accordance with various aspects of the subject disclosure, display-light sensors are integrated with the display (e.g., integrated with the pixel array). The display-light sensors are used to detect non-uniformities and/or changes in pixel performance during operation of the display. The detected non-uniformities and/or change in pixel performance can then be corrected by altering the display data or the analog control signals for content to be displayed. Further details of the displays with integrated display-light sensors are described hereinafter.

Figure 1:
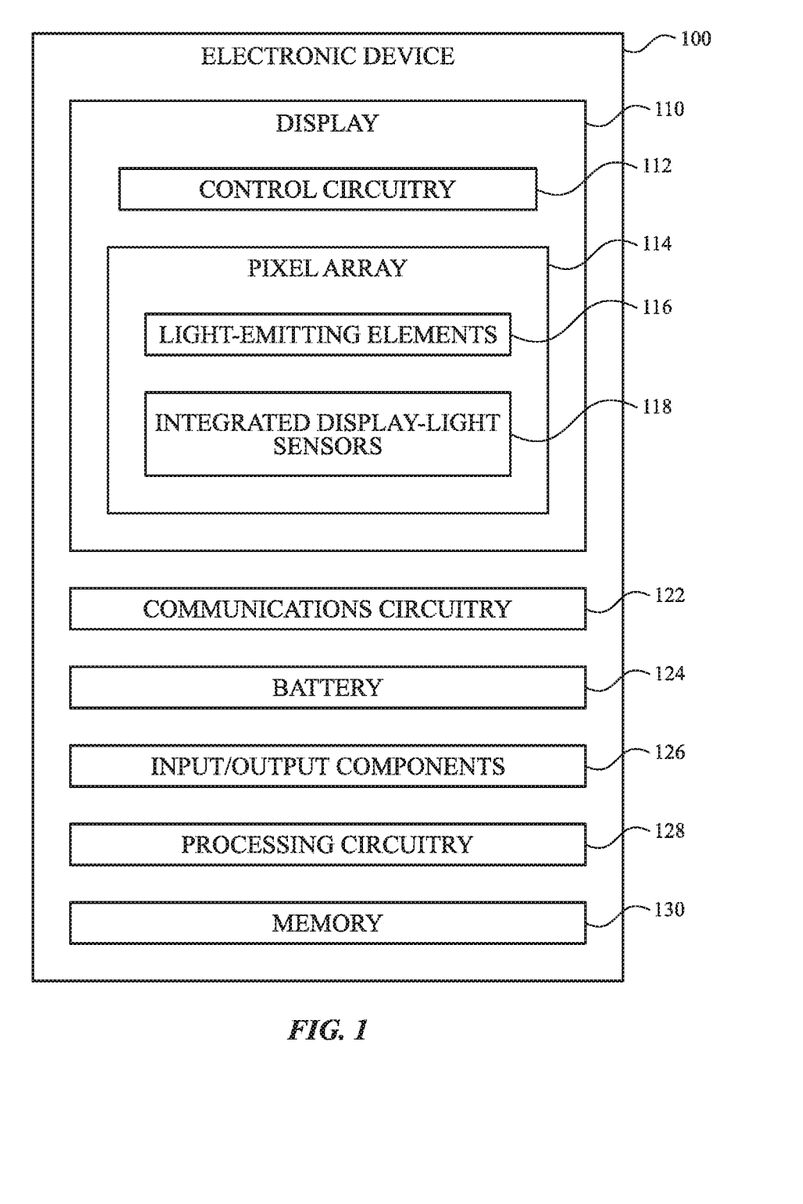
FIG. 1 illustrates a schematic diagram of an electronic device having a display with integrated display-light sensors in accordance with various aspects of the subject technology.

A schematic block diagram of an illustrative electronic device with a display having integrated display-light sensors is shown in FIG. 1. In the example of FIG. 1, device 100 includes display 110 having display control circuitry 112 and pixel array 114. Pixel array 114 includes light-emitting elements 116 and integrated display-light sensors 118. Light-emitting elements 116 may include pixels formed from light-emitting diodes (LEDs), organic light-emitting diodes (OLEDs), plasma cells, electrophoretic display elements, electrowetting display elements, liquid crystal display (LCD) components, or other suitable display pixel structures. Arrangements in which display 110 is formed using OLED pixels are sometimes described herein as an example.

Display-light sensors 118 are integrated with pixel array 114 such that each sensor is arranged and positioned to receive display light from one or more of light-emitting elements 116 of pixel array 114. Display-light sensors 118 may be integrated with pixel array 114 such that display-light sensors 118 are prevented from receiving light from outside the display (e.g., ambient light). In this way, display-light sensors 118 are arranged to provide display-light monitoring signals to display control circuitry 112 and/or other device circuitry (e.g., system circuitry such as processing circuitry 128). The display-light monitoring signals can be used to monitor the performance of one or more of light-emitting elements 116 and to correct for spatial non-uniformities and/or pixel performance degradation detected using the monitoring signals. Display control circuitry 112 and/or processing circuitry 128 can correct for non-uniformities and/or pixel degradation by altering digital display data for content to be provided to the display and/or by altering analog control signals to be provided to the pixel control circuitry in the pixel array (e.g., to transistor electrodes used to control the amount of light generated by each pixel).

Device 100 also includes processing circuitry 128 and memory 130. Memory 130 may include one or more different types of storage such as hard disk drive storage, nonvolatile memory (e.g., flash memory or other electrically-programmable-read-only memory), volatile memory (e.g., static or dynamic random-access-memory), magnetic or optical storage, permanent or removable storage and/or other non-transitory storage media configure to store static data, dynamic data, and/or computer readable instructions for processing circuitry 128. Processing circuitry 128 may be used in controlling the operation of device 100. Processing circuitry 128 may sometimes be referred to as system circuitry or a system-on-chip (SOC) for device 100.

Processing circuitry 128 may include a processor such as a microprocessor and other suitable integrated circuits, multi-core processors, one or more application specific integrated circuits (ASICs) or field programmable gate arrays (FPGAs) that execute sequences of instructions or code, as examples. In one suitable arrangement, processing circuitry 128 may be used to run software for device 100, such as, display content generation functions, display error detection functions, display content correction functions based on display-light sensor data, internet browsing applications, email applications, media playback applications, operating system functions, software for capturing and processing images, software implementing functions associated with gathering and processing sensor data, and/or software that controls audio, visual, and/or haptic functions.

In the example of FIG. 1, device 100 also includes communications circuitry 122, battery 124, and input/output components 126. Input/output components 126 may include a touch-sensitive layer of display 110, a keyboard, a touch-pad, and/or one or more real or virtual buttons. Input/output components 126 may also include audio components such as one or more speakers and/or one or more microphones. Communications circuitry 122 may be implemented using WiFi, near field communications (NFC), Bluetooth®, radio, microwave, and/or other wireless and/or wired communications circuitry. Communications circuitry 122 may be operated by processing circuitry 128 based on instructions stored in memory 130 to perform cellular telephone, network data, or other communications operations for device 100. Communications circuitry 122 may include WiFi and/or NFC communications circuitry operable to communicate with an external device such as a mobile telephone or other remote computing device.

Figure 2:
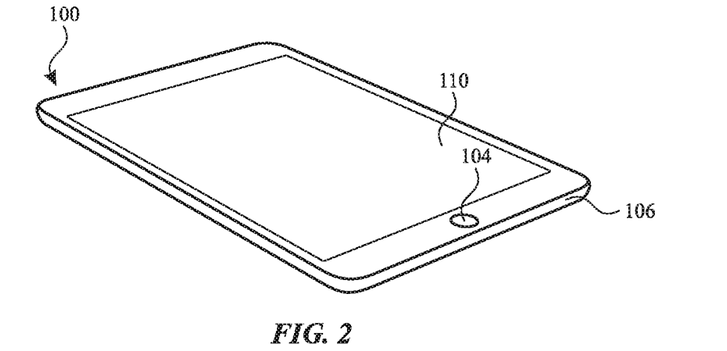
FIG. 2 illustrates a perspective view of an example electronic device having a display with integrated display-light sensors in accordance with various aspects of the subject technology.

FIG. 2 shows how device 100 may include a display mounted to a housing. In the example of FIG. 2, device 100 has been implemented using a housing that is sufficiently small to be portable and carried by a user (e.g., device 100 of FIG. 2 may be a handheld electronic device such as a tablet computer or a cellular telephone). As shown in FIG. 2, device 100 may include a display such as display 110 mounted on the front of housing 106. Display 110 may be substantially filled with active display pixels or may have an active portion and an inactive portion. Display 110 may have openings (e.g., openings in the inactive or active portions of display 110) such as an opening to accommodate button 104 and/or other openings such as an opening to accommodate a speaker, a light source, or a camera.

Display 110 may be a touch screen that incorporates capacitive touch electrodes or other touch sensor components or may be a display that is not touch-sensitive. Display 110 may include display pixels 116 and display-light sensors 118 as described above in connection with FIG. 1. The front surface of display 110 is visible in FIG. 2.

Housing 106, which may sometimes be referred to as a case, may be formed of plastic, glass, ceramics, fiber composites, metal (e.g., stainless steel, aluminum, etc.), other suitable materials, or a combination of any two or more of these materials.

The configuration of electronic device 100 of FIG. 2 is merely illustrative. In other implementations, electronic device 100 may be a computer such as a computer that is integrated into a display such as a computer monitor, a laptop computer, a somewhat smaller portable device such as a wrist-watch device, a pendant device, or other wearable or miniature device, a media player, a gaming device, a navigation device, a computer monitor, a television, or other electronic equipment.

For example, in some implementations, housing 106 may be formed using a unibody configuration in which some or all of housing 106 is machined or molded as a single structure or may be formed using multiple structures (e.g., an internal frame structure, one or more structures that form exterior housing surfaces, etc.). Although housing 106 of FIG. 2 is shown as a single structure, housing 106 may have multiple parts. For example, housing 106 may have upper portion and lower portion coupled to the upper portion using a hinge that allows the upper portion to rotate about a rotational axis relative to the lower portion. A keyboard such as a QWERTY keyboard and a touch pad may be mounted in the lower housing portion, in some implementations. In some implementations, electronic device 100 may be provided in the form of a computer integrated into a computer monitor. Display 110 may be mounted on a front surface of housing 106 and a stand may be provided to support housing (e.g., on a desktop).

Figure 3:
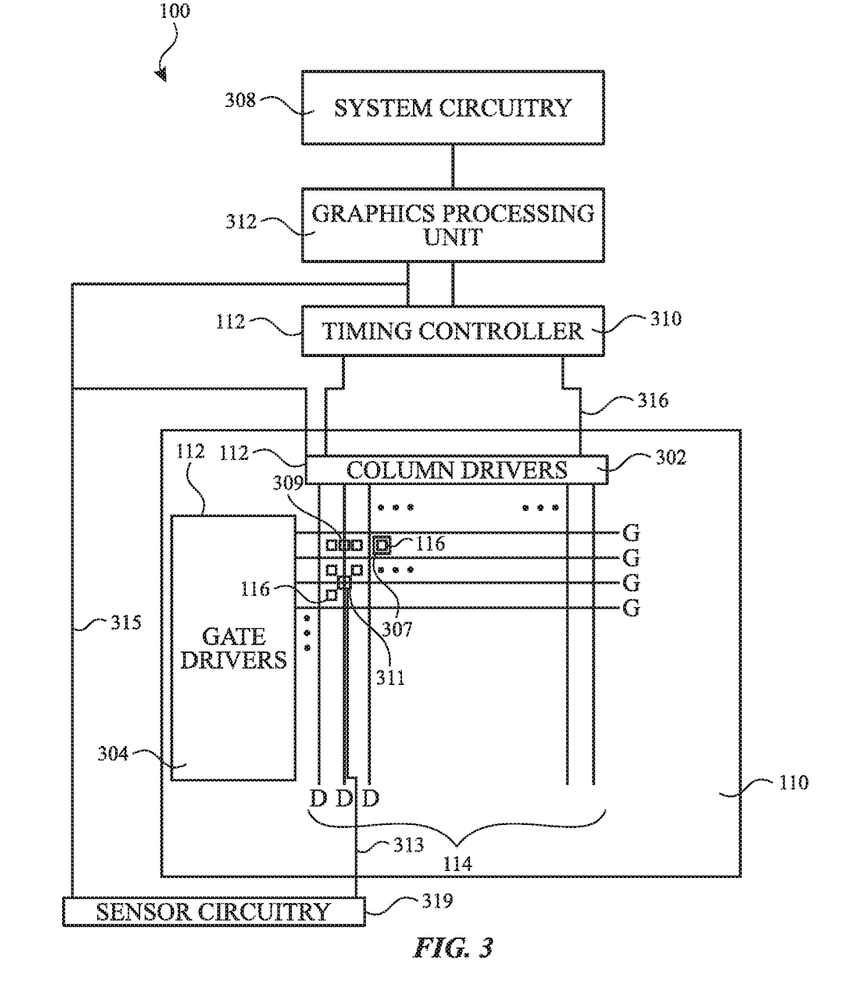
FIG. 3 illustrates a schematic diagram of exemplary display circuitry in accordance with various aspects of the subject technology.

FIG. 3 is a schematic diagram of device 100 showing illustrative circuitry that may be used in displaying images for a user of device 100 with pixel array 114 of display 110.

As shown in FIG. 3, display 110 may include column driver circuitry 302 that drives data signals (analog voltages) onto the data lines D of array 114. Gate driver circuitry 304 may drive gate line signals onto gate lines G of array 114.

Using the data lines D and gate lines G, light-emitting elements 116 implemented as display pixels in array 114 may be operated to display images on display 110. In some implementations, gate driver circuitry 304 may be implemented using thin-film transistor circuitry on a display substrate such as a glass or plastic display substrate or may be implemented using integrated circuits that are mounted on the display substrate or attached to the display substrate by a flexible printed circuit or other connecting layer. In some implementations, column driver circuitry 302 may be implemented using one or more column driver integrated circuits that are mounted on the display substrate or using column driver circuits mounted on other substrates.

Device 100 may include system circuitry 308. System circuitry 308 may include processor 128 and memory 130 as described above in connection with FIG. 1. Processing circuitry 128 in system circuitry 308 may sometimes be referred to herein as system circuitry or a system-on-chip (SOC) for device 100.

During operation of device 100, system circuitry 308 may produce data that is to be displayed on display 110. This display data may be provided to display control circuitry such as graphics processing unit (GPU) 312. For example, display frames, including display pixel values (e.g., each corresponding to a grey level) for display using pixels 116 (e.g., colored subpixels such as red, green, and blue subpixels) may be provided from system circuitry 308 to GPU 312. GPU 312 may process the display frames and provide processed display frames to timing controller integrated circuit 310.

Timing controller 310 may provide digital display data (e.g., pixel values, each corresponding to a grey level for display with one of display pixels 116) to column driver circuitry 302 using paths 316. Column driver circuitry 302 may receive the digital display data from timing controller 310. Using digital-to-analog converter circuitry within column driver circuitry 302, column driver circuitry 302 may provide corresponding analog output signals on the data lines D running along the columns of display pixels 116 of array 114.

Timing controller 310, column drivers 302, and gate drivers 304 may sometimes collectively be referred to herein as display control circuitry 112. Display control circuitry 112 may be used in controlling the operation of display 110. Display control circuitry 112 may be implemented, in some configurations, in a common package such as a display driver, a display controller, a display driver integrated circuit (IC), or a driver IC. Graphics processing unit 312 may perform image or other graphics processing on display data received from system circuitry 308 prior to providing the display data to display control circuitry 112 for display using pixels 116 of array 114. Graphics processing unit 312 may be a separate processing controller from system circuitry 308 or may be implemented as a part of system circuitry 308 (e.g., in a common SOC).

As shown in FIG. 3, display-light sensors 118 are arranged within or near pixel array 114 to receive display light generated by display pixels 116. As examples, sensors 118 can be implemented as overlapping sensors 307 having a light-sensitive area that overlaps some or all of the light-emitting area of one or more pixels 116, or as intermediate sensors 309 and 311. For example, one or more display-light sensors 309 may be interposed between two adjacent display pixels 116, one or more display-light sensors 311 may be interposed between the more than two display pixels 116 (e.g., between the four corners of four adjacent display pixels in array 114 as shown), and/or one or more display-light sensors 307 can overlap some or all of the light-emitting area of one or more pixels 116 (e.g., in front of, or behind the pixel).

Sensors 118 can be operated to sense and/or monitor the light output from a single pixel 116 at all sample times (e.g., a dedicated sensor 118 can be provided for each pixel 116), from multiple pixels at the same time (e.g., a regional sensor 118 can be provided for each of several subsets or regions of array 200 to monitor the overall light output in that region), or from multiple pixels individually or in groups at different times (e.g., by sampling the light output in a region of array 200 that receives light from all of the pixels in a subset or region of array 114 at times when only a single one or a further subset of the pixels in that region is in operation).

In one exemplary implementation, a display-light sensor 118 is provided for each active pixel 116 in array 200. In other exemplary implementations, a display-light sensor 118 is provided for every two, every three, every four, every six, every eight, every sixteen, every thirty-two, or every sixty-four pixels 116. In other exemplary implementations, a display-light sensor is provided for each of two, four, eight, sixteen, thirty-two, or sixty-four subsets of array 114 to sense and/or monitor the aggregate light of all or a subset of pixels 116 in that region.

Sensor circuitry 319 receives sensor signals from each sensor 118. For example, as shown in FIG. 3, sensor output lines such as sensor line 313 may run through some or all of array 114 to sensor circuitry 319. Sensor lines 313 may be traces on a display substrate (e.g., at a common vertical level or a different vertical level from the level at which data lines D and/or gate lines G run).

Sensor circuitry 319 receives an analog sensor signal, from each sensor 118, that is representative of the amount of display light that sensor has received (e.g., in a sampling time). Sensor circuitry 319 may convert the sampled display-light signal to a front-of screen brightness. For example, sensor circuitry 319 may convert the sampled display-light signal from a sensor 118 at a particular location in display 110 to a front-of-screen brightness for that location using a stored calibration. The stored calibration can be a color-specific calibration for each colored sub-pixel. The stored calibration may include a conversion factor, for each of several pixel grey levels, between a brightness measured at a sensor location for that grey level and a front-of-screen brightness for that grey level.

In this way, if the sensor data from a sensor 118 indicates that the brightness at the sensor location for a particular grey level has changed at the sensor location, the conversion value for that grey level can be used to determine a corresponding change in the front-of-screen brightness that may be causing an error in displaying the desired display content.

Sensor circuitry 319 then determines a correction value to be applied to any pixel(s) with a changed brightness or otherwise erroneous brightness, to correct the brightness of those pixel(s). Sensor circuitry 319 outputs the correction value for each pixel 116 in array 114 along communications lines 315. The correction value may be an analog correction value that is provided to, for example, column drivers 302 for a direct correction of the analog signals provided to pixels 116. In other examples, the correction value may be an analog or digital correction value that is provided to, for example, GPU 312 or timing controller 310. GPU 312 or timing controller 310 can correct the digital grey level for each pixel based on the received output from sensor circuitry 319. In some instances, the correction value may be determined based on a detected change in the light at a sensor location for a particular grey level, without performing a conversion to a front-of-screen brightness.

In the example of FIG. 3, sensor circuitry 319 is a separate circuit block (e.g., an integrated circuit) disposed separately from the panel on which array 114 is disposed. However, in other implementations, sensor circuitry 319 can be disposed on a common substrate (e.g., a display panel substrate) with array 114. In other implementations, sensor circuitry 319 can be incorporated into column driver circuitry 302, timing controller 310, GPU 312, or can be included locally within each sensor 118 such that the output of each sensor 118 is a feedback input (e.g., a compensation signal) that is provided directly to the pixel control circuitry for a corresponding pixel.

Figure 4:
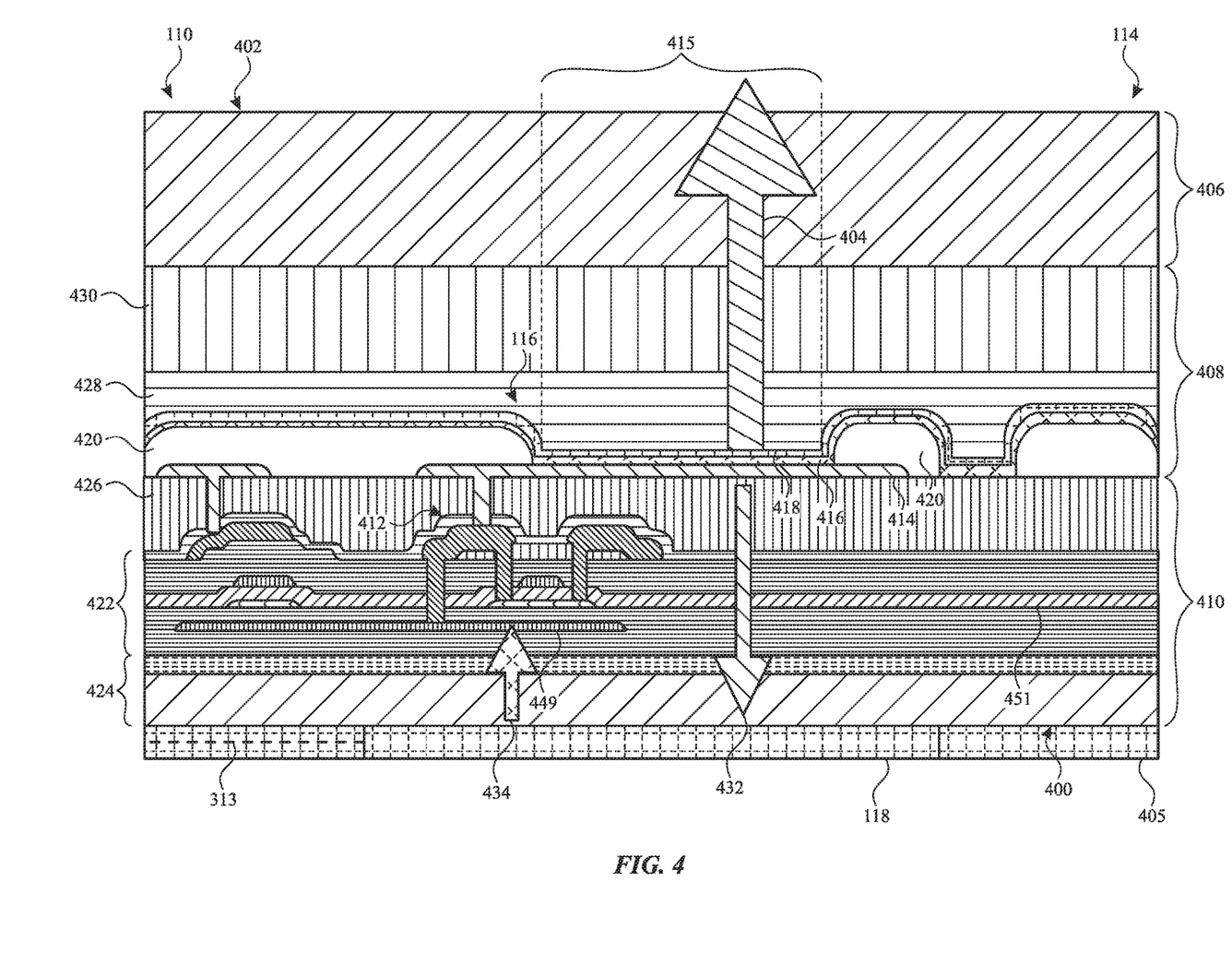
FIG. 4 illustrates a cross-sectional view of a portion of a display having display-light sensors disposed behind the display in accordance with various aspects of the subject technology.
Figure 5:
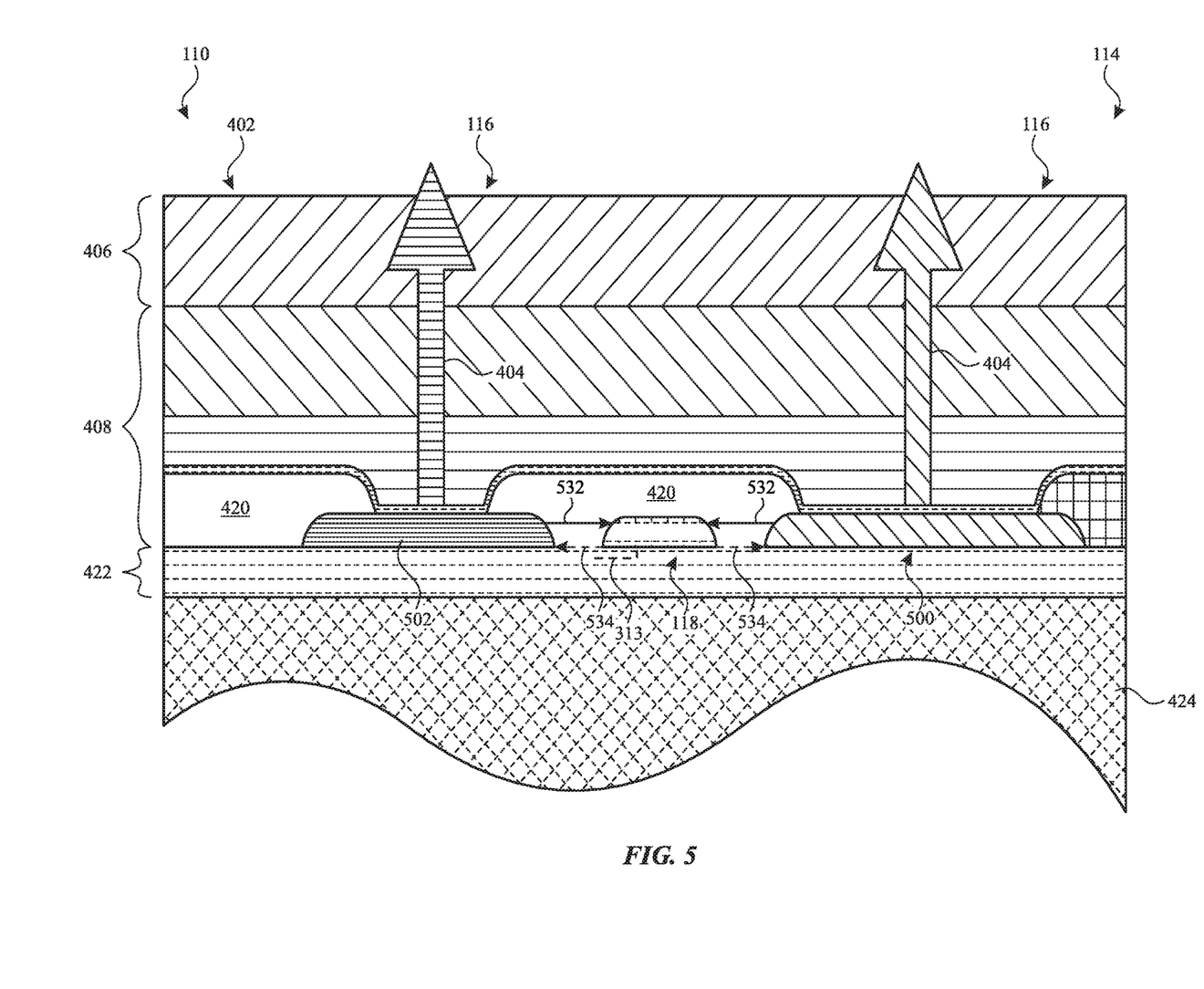
FIG. 5 illustrates a cross-sectional view of a portion of a display having display-light sensors disposed between display pixels of the display in accordance with various aspects of the subject technology.

FIG. 3 shows a plan view of array 200 in which exemplary lateral positions of display-light sensors 118 relative to the lateral positions of pixels 116 in array 200 (e.g., in, or parallel to, the plane of the array) can be seen. However, it should be appreciated that sensors 118 can be provided at various depths in the display panel in which array 200 is formed. FIGS. 4 and 5 show cross-sectional views of two different exemplary lateral and depth arrangements for sensors 118 in which an array of display-light sensors is mounted parallel to the array of display pixels and configured to receive a portion of the display light generated by the array of display pixels. In particular, FIG. 4 shows an example in which an overlapping sensor 118 is provided behind a display pixel 116 and overlapping the light-emitting area of the pixel. FIG. 5 shows an example in which a sensor 118 is interposed between the light-emitting elements of two adjacent display sub-pixels.

In the example of FIG. 4, display-light sensor 118 is attached to a rear surface 400 of display 110. Rear surface 400 is opposite to front surface 402 through which display light 404 is emitted by display pixel 116 to generate display content at front surface 402 of display 110. Front surface 402 may be an outer surface of device 100 and may, for example, be a surface of a transparent cover layer 406 such as a glass or plastic cover layer.

Cover layer 406 may include other layers such as a touch-sensitive layer (e.g., formed from an array of transparent electrodes such as indium tin oxide electrodes that sense user touch and/or other motions on or near front surface 402 of the display) and/or other layers such as antireflection coatings, smudge-resistant coatings, or optical layers. As shown, display layers 408 and thin-film-transistor (TFT) layers 410 are interposed between front 402 of display 110 and sensor 118.

Display layers 408 include various structures and layers for generating display light 404 responsive to control signals provided along gate lines G and data lines D that operate TFT 412 (e.g., a drive transistor for the pixel) in TFT layer 410. In the example of FIG. 4, display layers 408 form an array of OLED pixels 116 each formed from a portion of anode layer 414, organic emitter layer 416, and cathode layer 418, the portion defined by pixel definition layer 420. Pixel definition layer 420 may be formed from, for example, an optically opaque material that optically defines the light-emitting area 415 of pixel 116 and can also prevent non-display light such as ambient light from reaching sensor 118. As shown in the example of FIG. 4, sensor 118 is implemented as an overlapping sensor 307 in which the sensor area and the light emitting area 415 of a corresponding pixel 116 at least partially overlap for the sensor to receive portion 432 of the display light from that pixel.

TFT layers 410 include various circuit layers 422 (e.g., including transistor structures for transistors 412, gate lines G, and data lines D, gate insulation layers 451, shield metal layers 449, conductive vias, and buffer layers) formed on one or more substrate layers 424. Substrate layers 424 may include one or more polymer layers such as a polyimide layer and/or a polyethylene terephthalate (PET) layer. Circuit layers 422 may also include a planarization layer 426 formed over transistors 412 that forms a planar surface on which pixel structures such as anode 414 and pixel definition layer 420 of display layers 408 are formed. As shown, display layers may include additional layers such as a thin-film-encapsulation layer 428 and a polarizer layer 430.

Sensor 118 may be, for example, a complementary-metal-oxide-semiconductor (CMOS) sensor (e.g., a sensor that includes an n-type photodiode implant in a p-type substrate (or vice versa) that forms a p-n junction associated with a floating diffusion region) or another type of photodiode or other light sensor. As shown, sensor 118 may be attached to a surface of substrate layers 424 that forms the rear surface 400 of display 110 such that sensor 118 receives a portion 432 of the display light generated by pixel 116. In the example of FIG. 4, portion 432 of the display light generated by pixel 116 is backward emission from organic emitter material 416 that passes through semi-translucent anode 414, while a forward emission portion 404 is emitted toward and through front surface 402. The ratio of the backward emission 432 to forward emission 404 can be calibrated, for each of several grey levels, during manufacturing of display 110 and/or device 100 and stored device memory.

Sensor 118 may be formed in a substrate 405 in which sensor lines 313 are disposed. In one example, sensor 118 can be formed in an array of display-light sensors 118 such that substrate 405 containing the array of sensors can be attached (e.g., adhesively) to the surface 400 of display 110. In another example, sensors 118 may be formed in a common processing operation with the formation of TFT layer 410 and display layers 408 (e.g., by performing one or more additional etching, masking, deposition, patterning, lithography, or other semiconductor processing operations in addition to the processes for forming layers 408 and 410).

Sensor signals from sensor 118 may be routed to external processing circuitry such as sensor circuitry 319 via sensor lines 313 (e.g., so that modified control signals for pixel 116 can be provided to transistor 412 via data lines D and/or gate lines G) or sensor 118 may include feedback circuitry for generating and providing a compensation signal 434 directly to transistor 412.

FIG. 5 shows another example arrangement of a display-integrated display-light sensor. In the example of FIG. 5, display-light sensor 118 is disposed between, and in common plane, with display pixels 116. As shown, display-light sensors 118 can be formed on the same surface 500 of TFT layers 422 on which the light-emitting structures 502 (e.g., anode 414 and organic emitter material 416) of pixels 116 are formed (e.g., on a planarization layer).

In the example of FIG. 5, portions of pixel definition layer 420 are formed directly over sensors 118 to prevent non-display light such as ambient light from reaching display-light sensors 118. In the example of FIG. 5, sensor 118 receives a portion 532 of the display light generated by multiple pixels 116 (e.g., at a common time or a different times). Pixels 116 in FIG. 5 may be multi-color pixels, or single color pixels or sub-pixels.

In the example of FIG. 5, portion 532 of the display light generated by each of pixels 116 is lateral emission from organic emitter material 416 that travels parallel to surface 500 of TFT layers 422, while a forward emission portion 404 from that pixels is emitted toward and through front surface 402. The ratio of the lateral emission 532 to forward emission 404 can be calibrated, for each of several grey levels, during manufacturing of display 110 and/or device 100 and stored device memory.

In the example of FIG. 5, sensors 118 are formed in a common processing operation with the formation of TFT layer 410 and display layers 408 (e.g., by performing one or more additional etching, masking, deposition, patterning, lithography, or other semiconductor processing operations in addition to the processes for forming layers 408 and 410). Sensor signals from sensor 118 may be routed to external processing circuitry such as sensor circuitry 319 via sensor lines 313 in TFT layers 422 (e.g., so that modified control signals for pixel 116 can be provided to transistor 412 via data lines D and/or gate lines G) or sensor 118 may include feedback circuitry for generating and providing a compensation signal 534 directly to pixels 116.

It should also be appreciated that the arrangements of sensor 118 in FIGS. 4 and 5 are illustrative and other arrangements are contemplated in which one or more display-integrated sensors are arranged to receive display light from the display pixels of the display and to provide sensor signals that can be used to detect errors (e.g., pixel brightness non-uniformities or changes over time) in displaying display content on the display. As examples, the sensors can be arranged on the front of a backward emitting OLED display, on or between another of circuit layers 422, substrate layers 424, display layers 408 or cover layers 406 of an OLED display, or on or between one or more layers of another type of display such as an LCD display.

Figure 6:
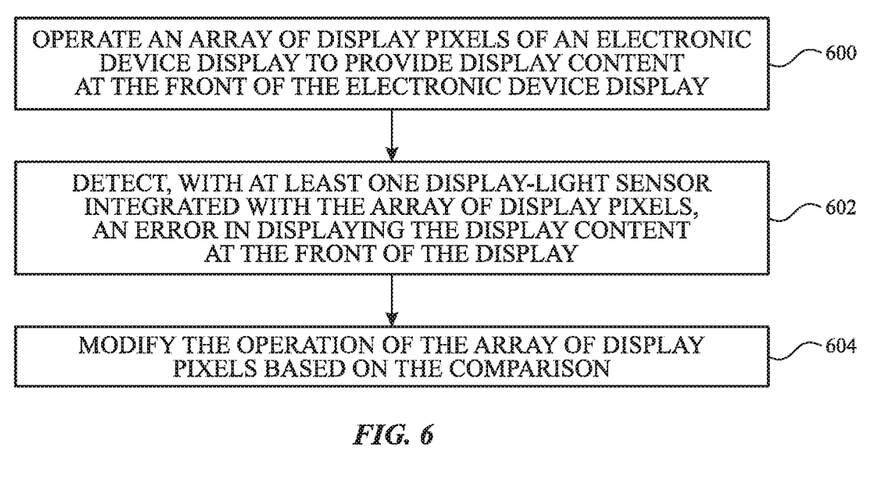
FIG. 6 illustrates a flow chart of illustrative operations for operating an electronic device having a display with display-light sensors in accordance with various aspects of the subject technology.

FIG. 6 depicts a flow diagram of an example process for operating an electronic device having a display with integrated display-light sensors, in accordance with various aspects of the subject technology. For explanatory purposes, the example process of FIG. 6 is described herein with reference to the components of FIGS. 1-4. Further for explanatory purposes, some blocks of the example process of FIG. 6 are described herein as occurring in series, or linearly. However, multiple blocks of the example process of FIG. 6 may occur in parallel. In addition, the blocks of the example process of FIG. 6 need not be performed in the order shown and/or one or more of the blocks of the example process of FIG. 6 need not be performed.

In the depicted example flow diagram, at block 600, an array of display pixels such as display pixels 116 of an electronic device display such as display 110 are operated. The display pixels are operated to provide display content at a front 402 of the display by generating display light with the display pixels.

At block 602, an error in displaying the display content at the front of the display is detected with at least one display-light sensor such as one or more of display-light sensors 118 integrated with the array of display pixels. The error may be caused by an array non-uniformity or a degradation over time of one or more of the display pixels.

Detecting the error may include receiving display light from the array of display pixels at the at least one display-light sensor. Receiving the display light may include receiving a portion of the display light that is not emitted through the front of the display and instead travels backward or laterally through a portion of the display. Receiving the display light may include receiving first display light from a first colored sub-pixel in the array of display pixels at a first time with a first one of the plurality of display-light sensors and receiving second display light from a second colored sub-pixel, adjacent to the first colored sub-pixel in the array of display pixels, at a second time with the first one of the plurality of display-light sensors. Receiving the display light may include receiving, with each of the plurality of display-light sensors, display light from a multiple pixels in corresponding region of the array of display pixels or from a single corresponding pixel.

Detecting the error may include, while operating the array of display pixels, gathering display-light data based on the received display light using a plurality of the display-light sensors 118 integrated in the display. Detecting the error may also include comparing the gathered display-light data with display-light calibration data. Comparing the gathered display-light data with the display-light calibration data may include mapping the measured display-light data at the location within the display (array) of each sensor to a front-of-screen brightness associated with that sensor location using a known conversion. The known conversion may be calibrated and stored for each pixel color. Comparing the gathered display-light data with the display-light calibration data may also include comparing the converted front-of-screen brightness to a calibrated (e.g., expected) front-of-screen brightness for a known grey level. Because the change in brightness of the pixel may be caused by pixel degradation over time, the determined actual brightness may be different from the expected brightness, even though the same control signals are being applied. For this reason, the display-integrated sensors can provide display correction information that would otherwise be difficult to obtain using only the control signals applied during operation of the display.

At block 604, the operation of the array of display pixels is modified to correct for the detected error. Modifying the operation of the array of display pixels may include generating and providing a compensation signal to the pixel control circuitry (e.g., a drive TFT) either directly from the sensor or via external sensor circuitry (e.g., external to the array area) such as sensor circuitry 319.

In accordance with various aspects of the subject disclosure, an electronic device having a display is provided, in which the display includes an array of display pixels configured to emit display light. A first portion of the display light is configured to be emitted from a front of the display to provide display content on the display. The display also includes a plurality of display-light sensors configured to receive a second portion of the display light from the array of display pixels. The display also includes display control circuitry configured to operate the array of display pixels to provide the display content on the display based, in part, on sensor signals generated by the plurality of display-light sensors responsive to receiving the second portion of the display light.

In accordance with other aspects of the subject disclosure, an electronic device having a display is provided, in which the display includes an array of display pixels configured to generate display light, a first portion of the display light configured to be emitted from a front of the display. The display also includes an array of display-light sensors mounted parallel to the array of display pixels and configured to receive a second portion of the display light generated by the array of display pixels.

In accordance with other aspects of the subject disclosure, a method of operating a display of an electronic device is provided, the method including operating an array of display pixels to provide display content at a front of the display and detecting, with at least one display-light sensor integrated with the array of display pixels, an error in displaying the display content at the front of the display. The method also includes modifying the operation of the array of display pixels to correct for the detected error.

Various functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "processor", and "memory" all refer to electronic or other technological devices. These terms exclude people or groups of people. For the purposes of the specification, the terms "display" or "displaying" means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device as described herein for displaying information to the user and a keyboard and a pointing device, such as a mouse or a trackball, by which the user can provide input to the computer. Other kinds of devices can be used to provide for interaction with a user as well; for example, feedback provided to the user can be any form of sensory feedback, such as visual feedback, auditory feedback, or tactile feedback; and input from the user can be received in any form, including acoustic, speech, or tactile input.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or design All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An electronic device having a display, the display comprising:
    an array of display pixels configured to emit display light, wherein a first portion of the display light including forward emission is configured to be emitted towards a front of the display to provide display content on the display;
    a plurality of display-light sensors configured to receive a second portion of the display light including backward emission from the array of display pixels; and
    display control circuitry configured to operate the array of display pixels to provide the display content on the display based, in part, on sensor signals generated by the plurality of display-light sensors responsive to receiving the second portion of the display light, wherein a ratio of the backward emission to forward emission is calibrated for each of several grey levels.

2. The electronic device of claim 1, wherein the display control circuitry is further configured to:
    receive display data corresponding to the display content from system circuitry for the electronic device;
    operate the array of display pixels to emit the display light based on the received display data;
    receive the sensor signals from the plurality of display-light sensors while operating the array of display pixels based on the received display data;
    modify the display data to generate modified display data corresponding to the display content; and
    operate the display to generate the display light based on the modified display data.

3. The electronic device of claim 2, wherein the sensor signals indicate that the display content is being incorrectly displayed due to pixel degradation or array non-uniformity associated with the array of display pixels, and wherein the modified display data includes a correction for the pixel degradation or array non-uniformity to ensure that the display content is correctly displayed even in the presence of the pixel degradation or array non-uniformity.

4. The electronic device of claim 2, wherein the modified display data is analog display data.

5. The electronic device of claim 2, wherein the modified display data is digital display data.

6. The electronic device of claim 2, wherein the plurality of display-light sensors are located at a plurality of corresponding sensor locations within the display, and wherein the display control circuitry is further configured to convert the sensor signals from each of the display-light sensors to a front-of-screen brightnesses associated with the sensor location corresponding to that display-light sensor, prior to modifying the display data.

7. The electronic device of claim 6, wherein at least one of the sensor locations is located behind the array of display pixels such that at least a portion of at least one display pixel is interposed between the front of the display and the at least one of the sensor locations.

8. The electronic device of claim 6, wherein at least one of the sensor locations is interposed between two adjacent display pixels in the array of display pixels.

9. An electronic device having a display, the display comprising:
    an array of display pixels configured to generate display light, a first portion of the display light including forward emission configured to be emitted towards a front of the display; and
    an array of display-light sensors mounted parallel to the array of display pixels and configured to receive a second portion of the display light including a lateral emission generated by the array of display pixels, wherein a ratio of the lateral emission to forward emission is calibrated for each of several grey levels.

10. The electronic device of claim 9, wherein the array of display-light sensors comprises a display-light sensor for each display pixel in the array of display pixels.

11. The electronic device of claim 9, wherein the array of display pixels is interposed between the array of display-light sensors and the front of the display.

12. The electronic device of claim 9, wherein the array of display pixels is interleaved, in a common plane, with the array of display-light sensors.

13. The electronic device of claim 9, wherein the display pixels are organic light-emitting diode pixels.

14. The electronic device of claim 9, further comprising at least one display layer configured to prevent non-display light from reaching the array of display-light sensors.

15. The electronic device of claim 14, wherein the at least one display layer comprises a pixel definition layer.

16. A method of operating a display of an electronic device, the method comprising:
  operating an array of display pixels to provide a first portion of display light including forward emission at a front of the display to provide display content;
   detecting, with at least one display-light sensor integrated with the array of display pixels, an error in displaying the display content at the front of the display based on receiving a second portion of the display light including a lateral emission generated by the array of display pixels; and
   modifying the operation of the array of display pixels to correct for the detected error, wherein a ratio of the lateral emission to forward emission is calibrated for each of several grey levels.

17. The method of claim 16, further comprising receiving display light from the array of display pixels at the at least one display-light sensor.

18. The method of claim 17, wherein the at least one display-light sensor comprises a plurality of display-light sensors, and wherein receiving the display light comprises:
  receiving first display light from a first colored sub-pixel in the array of display pixels at a first time with a first one of the plurality of display-light sensors; and
  receiving second display light from a second colored sub-pixel, adjacent to the first colored sub-pixel in the array of display pixels, at a second time with the first one of the plurality of display-light sensors.

19. The method of claim 17, further comprising converting a sensor signal generated by the at least one display-light sensor responsive to the received display light to a front-of-screen brightness.

20. The method of claim 17, wherein the at least one display-light sensor comprises a plurality of display-light sensors, and wherein receiving the display light comprises receiving, with each of the plurality of display-light sensors, display light from a corresponding region of the array of display pixels.

* * * * *